US007301978B2

(12) United States Patent
Ohgoh

(10) Patent No.: US 7,301,978 B2
(45) Date of Patent: Nov. 27, 2007

(54) SEMICONDUCTOR LASER ELEMENT WITH OPTICAL WAVEGUIDE LAYER HAVING INCREASED THICKNESS

(75) Inventor: Tsuyoshi Ohgoh, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 204 days.

(21) Appl. No.: 11/073,519

(22) Filed: Mar. 8, 2005

(65) Prior Publication Data
US 2005/0195878 A1   Sep. 8, 2005

(30) Foreign Application Priority Data
Mar. 8, 2004   (JP) ............... 2004-063880

(51) Int. Cl.
*H01S 5/00*   (2006.01)
(52) U.S. Cl. .............. 372/45.011; 372/43.01; 372/45.01
(58) Field of Classification Search ............. 372/43.01, 372/45.01
See application file for complete search history.

(56) References Cited
U.S. PATENT DOCUMENTS 5,157,679 A * 10/1992 Kondow et al. ......... 372/43.01
5,177,757 A * 1/1993 Tsugami ................. 372/45.01
5,502,739 A * 3/1996 Kidoguchi et al. ...... 372/45.01
5,600,667 A * 2/1997 Kidoguchi et al. ...... 372/45.01
6,798,808 B1 * 9/2004 Konushi et al. ........ 372/45.013

FOREIGN PATENT DOCUMENTS

JP        5-243669 A        9/1993

* cited by examiner

*Primary Examiner*—Minsun Oh Harvey
*Assistant Examiner*—Phillip Nguyen
(74) *Attorney, Agent, or Firm*—Sughrue Mion, PLLC

(57) ABSTRACT

In a semiconductor laser element: a lower cladding layer of $In_{0.49}(Al_{x1}Ga_{1-x1})_{0.51}P$ ($x2<x1<1$) of a first conductive type which lattice-matches with GaAs; a lower optical waveguide layer of $In_{0.49}(Al_{x2}Ga_{1-x2})_{0.51}P$ ($0<x2<x1$) which lattice-matches with GaAs; an active layer; an upper optical waveguide layer of $In_{0.49}(Al_{x2}Ga_{1-x2})_{0.51}P$ ($0<x2<x1$) which lattice-matches with GaAs; and an upper cladding layer of $In_{0.49}(Al_{x1}Ga_{1-x1})_{0.51}P$ ($x2<x1<1$) of a second conductive type which lattice-matches with GaAs are formed in this order on a substrate of GaAs. The total thickness of the lower optical waveguide layer, the active layer, and the upper optical waveguide layer is 0.30 micrometers or greater.

11 Claims, 4 Drawing Sheets

SEMICONDUCTOR LASER ELEMENT WITH OPTICAL WAVEGUIDE LAYER HAVING INCREASED THICKNESS

BACKGROUND OF THE INVENTION

1. Field of the Invention

The present invention relates to a semiconductor laser element, and in particular to a red semiconductor laser element which contains an InGaAlP-based material, and oscillates at a wavelength in the 0.6-μm band.

2. Description of the Related Art

Currently, efforts of developing the InGaAlP-based red semiconductor laser elements which oscillate at the wavelengths of 630 to 680 nm are being actively made for use as light sources in DVD (digital versatile disc) systems, laser pointers, barcode readers, displays, and the like. In particular, in the DVD-R (Recordable)/RW (ReWritable) systems, the data recording rate is required to be increased for handling a great amount of information, and therefore efforts of developing systems which realize higher data recording rates are being actively made. When the data recording rate increases, the length of time to form each pit is required to be decreased. Therefore, the semiconductor lasers used as the light sources are required to have high optical output power and high reliability.

A typical one of the conventional InGaAlP-based red semiconductor laser elements has the following structure. That is, an n-type InGaAlP cladding layer, an undoped InGaAlP optical waveguide layer, a multiple-quantum-well active layer, an InGaAlP optical waveguide layer, a p-type InGaAlP cladding layer, a p-type InGaP heterobuffer layer, and a p-type GaAs cap layer are formed in this order on an n-type GaAs substrate having a principal plane the crystal orientation of which is tilted 5 to 15 degrees from (100) toward (111). The p-type GaAs cap layer, the p-type InGaP heterobuffer layer, and the p-type InGaAlP cladding layer forms a ridge, and the spaces on both sides of the ridge are filled with an n-type GaAs current-blocking layer. In addition, a p-type GaAs contact layer is formed on the p-type GaAs cap layer and the n-type GaAs current-blocking layer. Further, a p-side electrode is formed on the contact layer, and an n-side electrode is formed on the back surface of the substrate.

In most of the conventional semiconductor laser elements, the total thickness of the active layer and the optical waveguide layers is 0.18 to 0.28 micrometers, and a great amount of light generated in the active layer leaks into the cladding layers. Therefore, the thickness of each cladding layer is increased to 1 to 1.2 micrometers so as to prevent loss of the light.

The structure of the conventional semiconductor laser element described above has the following problems (1) and (2) since the cladding layers are made of InGaAlP.

(1) Since InGaAlP exhibits higher specific resistance and higher thermal resistance than AlGaAs, the operating voltage of and the heat generation in each semiconductor laser element increase with the thicknesses of the cladding layers. That is, the increase in the thicknesses of the InGaAlP cladding layers adversely affects the characteristics of the semiconductor laser element.

(2) Since the diffusion coefficient of Zn as a p-type dopant in the InGaAlP materials is great, Zn greatly diffuses into crystals during growth or heat treatment of the crystals, and the diffused Zn intrudes into the active layer and produce non-radiative recombination centers in the active layer, so that the characteristics of the semiconductor laser element deteriorate.

In order to solve the problem (1), Japanese Unexamined Patent Publication No. 5(1993)-243669 discloses the following structure for efficiently confining light.

In the disclosed structure, one or two optical waveguide layers are asymmetrically arranged with respect to an active layer (e.g., an optical waveguide layer is arranged on only the n side of the active layer, or the optical waveguide layer on the n side of the active layer has a greater thickness than the optical waveguide layer on the p side of the active layer), and a high-refractive-index layer having a similar refractive index to the average refractive index of a waveguide layer constituted by the active layer and the one or two optical waveguide layers is arranged in the cladding layer on the n side of the active layer. Since the total thickness of the one or two cladding layers can be reduced in the above structure, the electric resistance and the heat resistance of the semiconductor laser element can be suppressed.

On the other hand, in order to solve the problem (2), U.S. Pat. No. 6,798,808 discloses a structure of a semiconductor laser element for preventing the diffusion of Zn. In the structure disclosed in U.S. Pat. No. 6,798,808, an undoped layer or a layer having a small carrier concentration is arranged as a portion of a cladding layer in a vicinity of an active layer.

However, when the cladding layer on the p side of the active layer is eliminated or the thickness of the cladding layer on the p side of the active layer is reduced as disclosed in Japanese Unexamined Patent Publication No. 5(1993)-243669, the influence of the diffusion of Zn (the problem (2)) becomes more serious. On the other hand, when an undoped layer or a layer having a small carrier concentration is arranged as a portion of a cladding layer in a vicinity of an active layer as disclosed in U.S. Pat. No. 6,798,808, the temperature characteristics of the semiconductor laser element deteriorate with decrease in the carrier concentration in the cladding layer since the carriers in the above portion of the cladding layer in the vicinity of the active layer raise the Fermi level and substantially strengthen the confinement of carriers in the active layer.

SUMMARY OF THE INVENTION

The present invention has been developed in view of the above circumstances.

The object of the present invention is to provide a semiconductor laser element being formed of InGaAlP-based materials and having improved static characteristics and a long lifetime.

In order to accomplish the aforementioned object, the present invention is provided. According to the present invention, there is provided a semiconductor laser element comprising: a substrate made of GaAs; a lower cladding layer formed above the substrate and made of $In_{0.49}(Al_{x1}Ga_{1-x1})_{0.51}P$ (x2<x1<1) of a first conductive type which lattice-matches with GaAs; a lower optical waveguide layer formed above the lower cladding layer and made of $In_{0.49}(Al_{x2}Ga_{1-x2})_{0.51}P$ (0<x2<x1) which lattice-matches with GaAs; an active layer formed above the lower optical waveguide layer; an upper optical waveguide layer formed above the active layer and made of $In_{0.49}(Al_{x2}Ga_{1-x2})_{0.51}P$ (0<x2<x1) which lattice-matches with GaAs; and an upper cladding layer formed above the upper optical waveguide layer and made of $In_{0.49}(Al_{x1}Ga_{1-x1})_{0.51}P$ (x2<x1<1) of a second conductive type which lattice-matches with GaAs. In the semiconductor laser element, the total thickness of the lower optical waveguide layer, the active layer, and the upper optical waveguide layer is 0.30 micrometers or greater.

Preferably, the semiconductor laser element according to the present invention may also have one or any possible combination of the following additional features (i) to (iii).

(i) The total thickness of the lower optical waveguide layer, the active layer, and the upper optical waveguide layer is 0.35 to 0.6 micrometers.

(ii) At least one of the lower cladding layer and the upper cladding layer has a thickness of 0.8 micrometers or smaller, and more preferably 0.6 micrometers or smaller.

(iii) The active layer is made of $In_{0.49}(Al_{x3}Ga_{1-x3})_{0.51}P$ ($0 \leq x3 < x2$), and the semiconductor laser element has an oscillation wavelength of 620 to 680 nm.

Since the total thickness of the active layer and the optical waveguide layers is arranged to be 30 micrometers or greater in the semiconductor laser element according to the present invention, it is possible to suppress leakage of light into the cladding layers, and reduce the total thickness of the InGaAlP cladding layers. Since the electric resistance and the heat resistance of the InGaAlP cladding layers are great, it is possible to suppress heat generation during operation and deterioration of the characteristics of the semiconductor laser element.

In addition, when the total thickness of the active layer and the optical waveguide layers is 30 micrometers or greater, the thickness of at least one of the optical waveguide layers in the semiconductor laser element according to the present invention is greater than the thicknesses of the optical waveguide layers of the conventional semiconductor laser elements. Therefore, when the optical waveguide layer on the p side of the active layer is undoped, the undoped layer extends between the p-type cladding layer and the active layer. Thus, it is possible to suppress diffusion of Zn into the active layer and deterioration of the semiconductor laser element. In addition, since the optical waveguide layer on the p side of the active layer has the function of protecting diffusion of Zn, it is unnecessary to insert an undoped layer in the p-type cladding layer in the semiconductor laser element according to the present invention, while an undoped layer is inserted as a portion of a cladding layer in a vicinity of an active layer for protecting diffusion of Zn in the semiconductor laser element disclosed in U.S. Pat. No. 6,798,808. Therefore, it is possible to avoid the weakening of the confinement of carriers which is caused by insertion of the undoped layer in the cladding layer.

DESCRIPTION OF PREFERRED EMBODIMENTS

An embodiment of the present invention is explained in detail below with reference to drawings.

Structure of Embodiment

Figure 1:
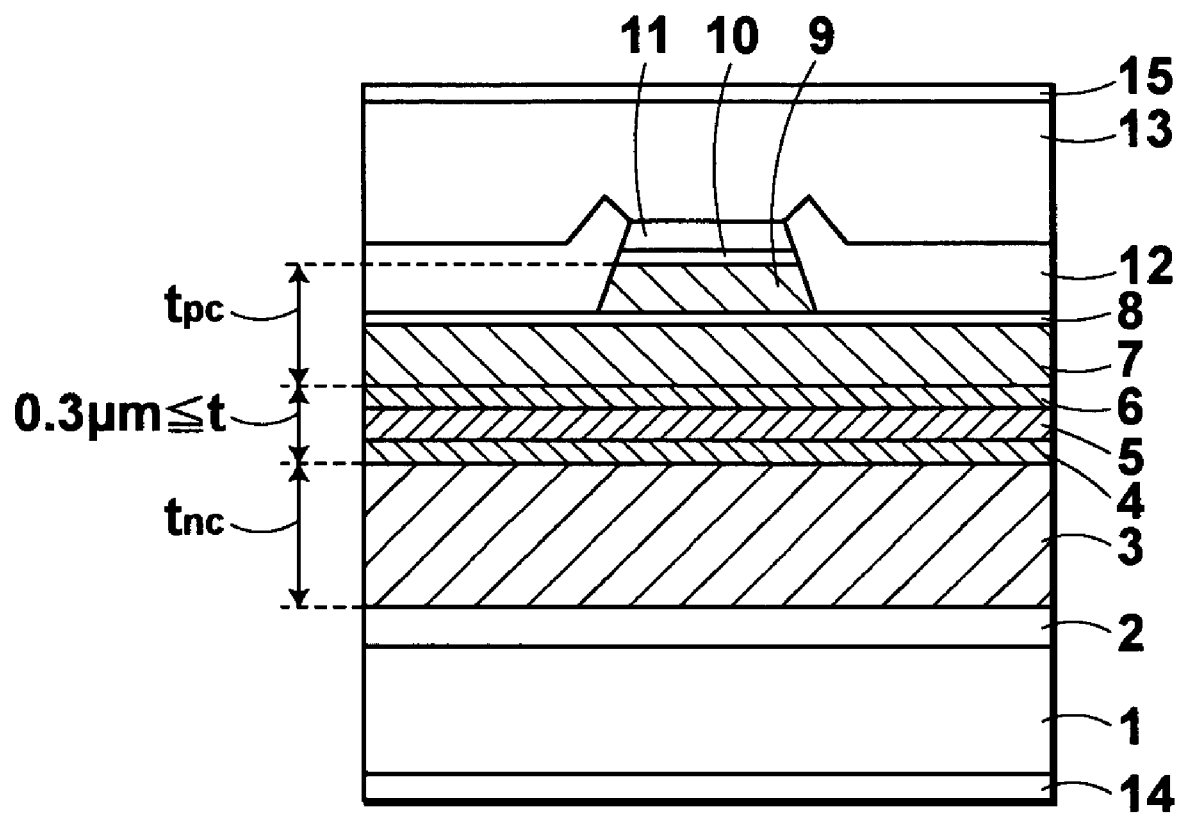
FIG. 1 is a cross-sectional view of a semiconductor laser element according to an embodiment of the present invention.

FIG. 1 is a cross-sectional view illustrating a cross section of a semiconductor laser element according to an embodiment of the present invention, where the cross section is perpendicular to the direction of the resonator.

As illustrated in FIG. 1, the semiconductor laser element according to the present embodiment has a structure in which an n-type GaAs buffer layer 2, an n-type $In_{0.49}(Al_{0.7}Ga_{0.3})_{0.51}P$ lower cladding layer 3, an undoped $In_{0.49}(Al_{0.5}Ga_{0.5})_{0.51}P$ lower optical waveguide layer 4, a multiple-quantum-well active layer 5, an undoped $In_{0.49}(Al_{0.5}Ga_{0.5})_{0.51}P$ upper optical waveguide layer 6, a p-type $In_{0.49}(Al_{0.7}Ga_{0.3})_{0.51}P$ first upper cladding layer 7, and a p-type $In_{0.49}Ga_{0.51}P$ etching-stop layer 8 are formed in this order on an n-type GaAs substrate 1 having a principal plane the crystal orientation of which is tilted 5 to 15 degrees from (100) toward (111). In addition, a p-type $In_{0.49}(Al_{0.7}Ga_{0.3})_{0.51}P$ second upper cladding layer 9, a p-type $In_{0.49}Ga_{0.51}P$ heterobuffer layer 10, and a p-type GaAs cap layer 11 are formed in this order on the p-type $In_{0.49}Ga_{0.51}P$ etching-stop layer 8. The widths of the p-type $In_{0.49}(Al_{0.7}Ga_{0.3})_{0.51}P$ second upper cladding layer 9, the p-type $In_{0.49}Ga_{0.51}P$ heterobuffer layer 10, and the p-type GaAs cap layer 11 are smaller than the widths of the layers below the p-type $In_{0.49}(Al_{0.7}Ga_{0.3})_{0.51}P$ second upper cladding layer 9 so that the p-type $In_{0.49}(Al_{0.7}Ga_{0.3})_{0.51}P$ second upper cladding layer 9, the p-type $In_{0.49}Ga_{0.51}P$ heterobuffer layer 10, and the p-type GaAs cap layer 11 form a ridge. Further, an n-type GaAs current-blocking layer 12 is formed on both sides of the above ridge, and a p-type GaAs contact layer 13 is formed so as to cover the ridge and the n-type GaAs current-blocking layer 12. Furthermore, a p-side electrode 15 is formed on the p-type GaAs contact layer 13, and an n-side electrode 14 is formed on the back surface of the n-type GaAs substrate 1.

In the semiconductor laser element according to the present embodiment, the total thickness t of the multiple-quantum-well active layer 5 and the optical waveguide layers 4 and 6 is 0.30 micrometers or greater. Preferably, the total thickness t is 0.35 to 0.6 micrometers. In addition, at least one of the thickness $t_{nc}$ of the n-type lower cladding layer 3 and the thickness $t_{pc}$ of the p-side cladding layers is 0.8 micrometers or smaller, and preferably 0.6 micrometers or smaller. In this example, the thickness $t_{pc}$ of the p-side cladding layers is defined as the total thickness of the p-type $In_{0.49}(Al_{0.7}Ga_{0.3})_{0.51}P$ first upper cladding layer 7, the p-type $In_{0.49}Ga_{0.51}P$ etching-stop layer 8, and the p-type $In_{0.49}(Al_{0.7}Ga_{0.3})_{0.51}P$ second upper cladding layer 9.

The multiple-quantum-well active layer 5 is constituted by $In_{0.49}(Al_{x3}Ga_{1-x3})_{0.51}P$ quantum-well layers ($0 \leq x3 < 0.5$) and $In_{0.49}(Al_{0.5}Ga_{0.5})_{0.51}P$ barrier layers, where the number of the quantum-well layers is three or four, and the thickness of each of the quantum-well layers and the barrier layers is about 6 nm. When the number of the quantum-well layers is three, the thickness of the multiple-quantum-well active layer 5 becomes about 30 nm. Generally, the thickness of the multiple-quantum-well active layer 5 is about 50 nm or smaller.

Production Process

Next, a process for producing the semiconductor laser element illustrated in FIG. 1 is explained below.

First, in the stage of the first crystal growth, an n-type GaAs layer realizing the n-type GaAs buffer layer 2, an n-type $In_{0.49}(Al_{0.7}Ga_{0.3})_{0.51}P$ layer realizing the n-type $In_{0.49}(Al_{0.7}Ga_{0.3})_{0.51}P$ lower cladding layer 3, a first undoped $In_{0.49}(Al_{0.5}Ga_{0.5})_{0.51}P$ layer realizing the undoped $In_{0.49}(Al_{0.5}Ga_{0.5})_{0.51}P$ lower optical waveguide layer 4, layers realizing the multiple-quantum-well active layer 5, a second undoped $In_{0.49}(Al_{0.5}Ga_{0.5})_{0.51}P$ layer realizing the undoped $In_{0.49}(Al_{0.5}Ga_{0.5})_{0.51}P$ upper optical waveguide layer 6, a first p-type $In_{0.49}(Al_{0.7}Ga_{0.3})_{0.51}P$ layer realizing the p-type $In_{0.49}(Al_{0.7}Ga_{0.3})_{0.51}P$ first upper cladding layer 7, a p-type $In_{0.49}Ga_{0.51}P$ layer realizing the p-type $In_{0.49}Ga_{0.51}P$ etching-stop layer 8, a second p-type $In_{0.49}(Al_{0.7}Ga_{0.3})_{0.51}P$ layer realizing the p-type $In_{0.49}(Al_{0.7}Ga_{0.3})_{0.51}P$ second upper cladding layer 9, a p-type $In_{0.49}Ga_{0.51}P$ layer realizing the p-type $In_{0.49}Ga_{0.51}P$ heterobuffer layer 10, and a p-type GaAs layer realizing the p-type GaAs cap layer 11 are formed in this order on the n-type GaAs substrate 1 having a principal plane the crystal orientation of which is tilted 5 to 15 degrees from (100) toward (111), by organometallic chemical vapor deposition.

Subsequently, a $SiO_2$ insulation film is formed on the p-type GaAs layer realizing the p-type GaAs cap layer 11, and a mask for selective growth constituted by stripes of $SiO_2$ each having a predetermined width is formed by using photolithography or the like. Then, the portions of the p-type GaAs layer realizing the p-type GaAs cap layer 11, the p-type $In_{0.49}Ga_{0.51}P$ heterobuffer layer 10, and the p-type $In_{0.49}(Al_{0.7}Ga_{0.3})_{0.51}P$ second upper cladding layer 9 which are not located under the stripes of $SiO_2$ are etched off so that a mesa stripe structure realizing the aforementioned ridge is formed in correspondence with each of the stripes of $SiO_2$, and the p-type $In_{0.49}Ga_{0.51}P$ etching-stop layer 8 is exposed on both sides of the mesa stripe (ridge), where the mesa stripe has a width corresponding to the width of each stripe of $SiO_2$. Next, the n-type GaAs current-blocking layer 12 is grown on the exposed areas of the p-type $In_{0.49}Ga_{0.51}P$ etching-stop layer 8 by selective growth (as the second crystal growth) using the above mask. Then, the above mask is removed, and the p-type GaAs contact layer 13 is grown (as the third crystal growth) so as to cover the above ridge and the n-type GaAs current-blocking layer 12.

Thereafter, the back side of the n-type GaAs substrate 1 is polished until the total thickness of the structure layered as above becomes about 100 micrometers, and the n-side electrode 14 and the p-side electrodes 15 are respectively formed on the polished back surface of the n-type GaAs substrate 1 and the p-type GaAs contact layer 13 by evaporation and heat treatment.

Finally, laser bars realizing the resonator length of about 0.30 to 1.0 mm are cut out by cleavage from the layered structure formed as above. Subsequently, the opposite cleaved faces of each laser bar are coated with a low-reflectance film and a high-reflectance film, respectively. Thereafter, each laser bar is divided into chips by cleavage. Thus, the semiconductor laser element having the cross section illustrated in FIG. 1 is completed, where the cross section illustrated in FIG. 1 is parallel to the resonator surfaces of the semiconductor laser element.

In the above structure of the semiconductor laser element, the active layer may be a strained active layer having a compressed or tensile strain.

The composition of each of the layers in the above structure is determined so as to lattice-match with the GaAs substrate. The composition of each layer is not limited to the values indicated in the above explanations as far as each layer lattice-matches with the GaAs substrate. For example, the cladding layers may be made of $In_{0.49}(Al_{x1}Ga_{1-x1})_{0.51}P$ (x2<x1<1), the optical waveguide layers may be made of $In_{0.49}(Al_{x2}Ga_{1-x2})_{0.51}P$ (0<x2<x1), and the active layer may be made of $In_{0.49}(Al_{x3}Ga_{1-x3})_{0.51}P$ (0≦x3<x2). When the composition of the active layer is controlled within the above range, the semiconductor laser element can be designed to oscillate at the wavelength of 620 to 680 nm.

Although the optical waveguide layers in the above structure are undoped, a portion of the optical waveguide layers may be doped as far as the diffusion of Zn does not occur.

Variations

The present invention is not limited to the above embodiment, and various modifications can be made within the scope of the present invention. The following are examples of such modifications.

(i) Although the semiconductor laser element described above is a loss-guide type semiconductor laser element, the present invention can also be applied to real-index-guided semiconductor laser elements, gain-guided semiconductor laser elements, semiconductor laser elements having a diffraction grating, and the like.

(ii) Although the semiconductor laser element described above oscillates in a fundamental transverse mode, the present invention can also be applied to wide-stripe semiconductor laser elements which oscillate in multiple transverse modes.

(iii) The present invention can also be applied to bar-shaped one-dimensionally-arrayed lasers, and two-dimensionally-arrayed lasers.

(iv) Although an n-type GaAs substrate is used in the described embodiment, instead, a p-type GaAs substrate may be used. When the GaAs substrate is p-type, the conductivity types of all of the other layers in the structure of the described embodiment should be inverted.

Advantages of the Invention

As mentioned before, since the total thickness of the active layer and the optical waveguide layers (located on both sides of the active layer) is 30 micrometers or greater in the semiconductor laser element according to the present invention, it is possible to reduce the total thickness of the InGaAlP cladding layers (which have great electric and heat resistance) compared with the conventional semiconductor laser elements. Therefore, it is possible to suppress heat generation during operation and deterioration of characteristics of the semiconductor laser element.

Hereinbelow, the above advantages are elaborated in detail with reference to FIGS. 2A to 4.

Figure 2A:
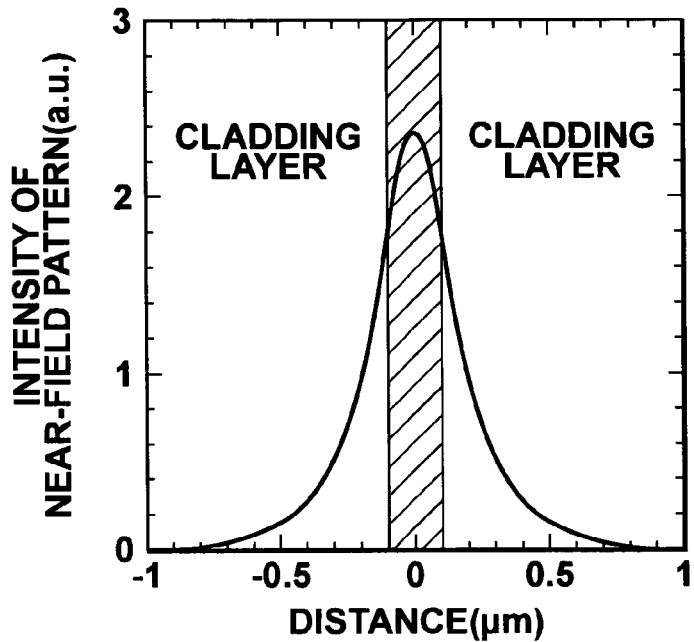
FIGS. 2A and 2B are diagrams indicating the intensity distributions in near-field patterns of laser light emitted from semiconductor laser elements which are different in the total thickness of an active layer and optical waveguide layers.
Figure 2B:
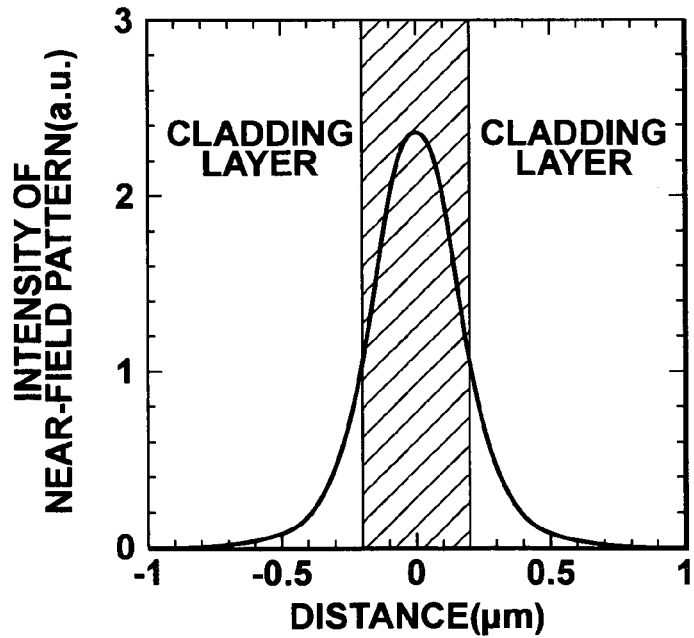

FIGS. 2A and 2B are diagrams indicating intensity distributions in near-field patterns (NFPs) of laser light emitted from semiconductor laser elements which are identical in the optical power density of an active layer and different in the total thickness of the active layer and optical waveguide layers. Although both of the semiconductor laser elements the NFPs of which are indicated in FIGS. 2A and 2B have a structure approximately identical to the structure of FIG. 1, the total thickness of the active layer and the optical waveguide layers is 0.184 micrometers in the semiconductor laser element the NFP of which is indicated in FIG. 2A, and 0.424 micrometers in the semiconductor laser element the NFP of which is indicated in FIG. 2B. In each of FIGS. 2A and 2B, the width of the hatched area corresponds to the total thickness of the active layer and the optical waveguide layers in the corresponding semiconductor laser element.

Figure 4:
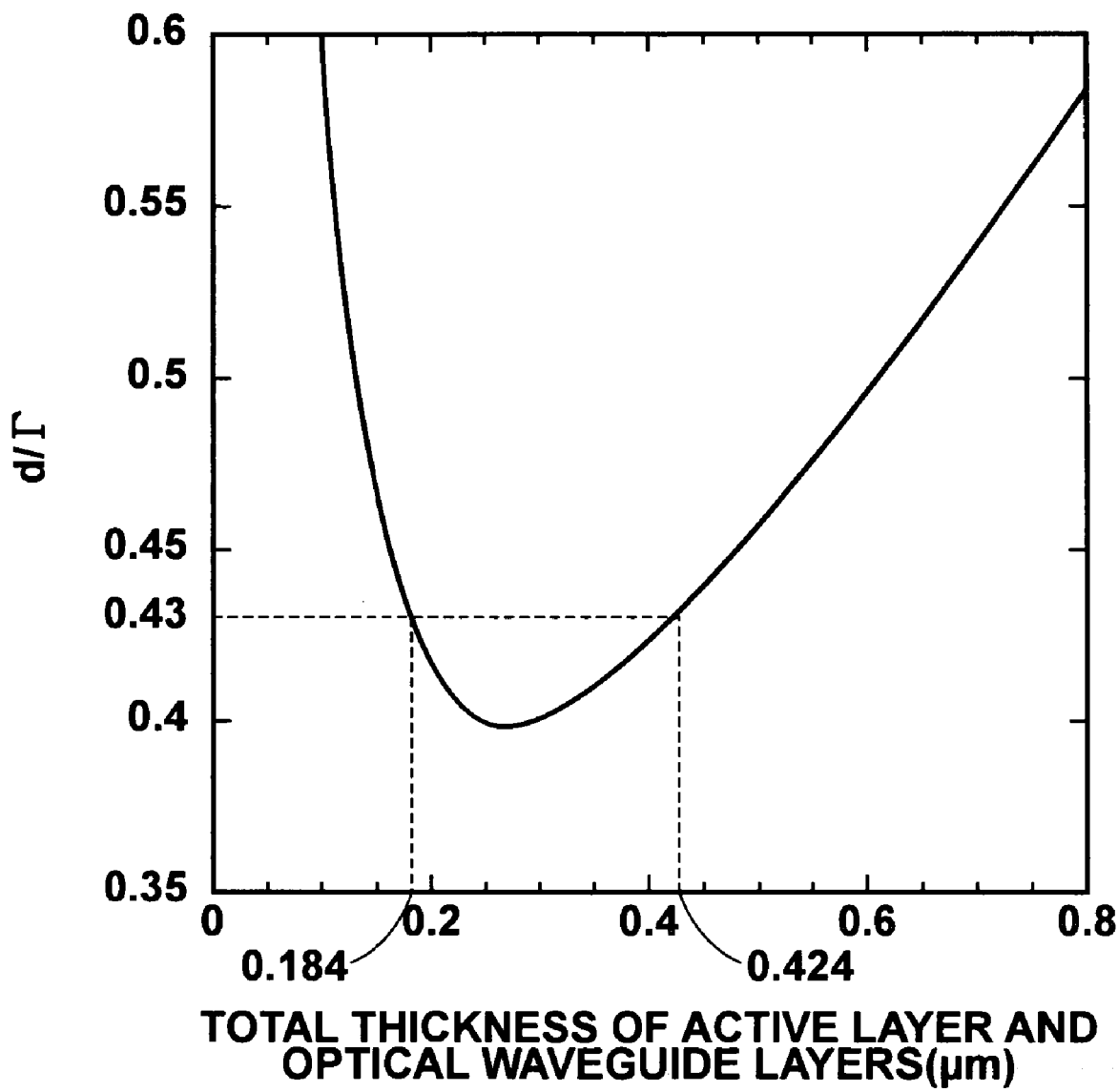
FIG. 4 is a graph indicating a relationship between the optical power density and the total thickness of an active layer and optical waveguide layers.

For reference, FIG. 4 shows a relationship between the total thickness of an active layer and optical waveguide layers and the optical power density (indicated by the reciprocal of d/Γ) in a semiconductor laser element having a structure approximately identical to the structure of FIG. 1 and oscillating at a wavelength of 660 nm, where d is the thickness of the active layer, and Γ is the optical confinement factor. When the total thickness of the active layer and optical waveguide layers increases from zero, the optical confinement also increases, and is maximized when the total thickness of the active layer and optical waveguide layers is 0.28 micrometers.

Specifically, the values of the total thickness of the active layer and the optical waveguide layers in the semiconductor laser elements the NFPs of which are indicated in FIGS. 2A and 2B are 0.184 and 0.424 micrometers, respectively. In addition, the common value of d/Γ of the semiconductor laser elements is about 0.43. When the total thickness of the active layer and the optical waveguide layers increases, i.e., when the total thickness of the optical waveguide layers increases, the threshold current increases. Therefore, conventionally, when an identical optical power density is obtained at two values of the total thickness of the active layer and the optical waveguide layers, the smaller value of the total thickness of the active layer and the optical waveguide layers is chosen.

When the thickness of at least one of the optical waveguide layers is small as indicated in FIG. 2A, laser light generated in the active layer deeply leaks into a cladding layer. If the thickness of the cladding layer is increased in such a situation, the laser light penetrates to a GaAs layer (a substrate or a contact layer) next to the cladding layer, and therefore optical loss occurs. Thus, in the conventional semiconductor laser elements, in order to prevent decrease in the output power of the laser light due to the optical loss, the thickness of the cladding layer is designed to be 1 micrometer or greater. On the other hand, when the thickness of at least one of the optical waveguide layers is great as indicated in FIG. 2B, it is possible to confine laser light in the vicinities of the optical waveguide layers and reduce the leakage of the laser light into the cladding layers. Therefore, the thicknesses of the cladding layers can be reduced compared with the case of FIG. 2A.

Specifically, FIGS. 2A and 2B show that the cladding layer on each side of the active layer in the semiconductor laser element in which the total thickness of the active layer and the optical waveguide layers is 0.184 micrometers is required to have a thickness of about 0.9 micrometers or greater, while it is sufficient for the cladding layer on each side in the semiconductor laser element in which the total thickness of the active layer and the optical waveguide layers is 0.424 micrometers to have a thickness of about 0.5 micrometers or greater. However, in most cases, in order to guarantee the performance against variations in manufacture, the cladding layers are designed to have a thickness 0.1 to 0.3 micrometers greater than the above values of the thickness of the cladding layers. Therefore, in the semiconductor laser elements in which the total thickness of the active layer and the optical waveguide layers is 0.184 micrometers, the cladding layers are designed to have a thickness of 1.0 to 1.2 micrometers. On the other hand, in the semiconductor laser element in which the total thickness of the active layer and the optical waveguide layers is 0.424 micrometers, even when the variations in manufacture are taken into consideration, it is possible to realize cladding layers having a thickness of 0.6 to 0.8 micrometers.

In order to clarify another effect obtained by reducing the thicknesses of the InGaAlP cladding layers, the present inventor has produced first and second groups of samples of semiconductor laser elements which have identical optical power densities in their active layers, where the thicknesses of the p-type and n-type InGaAlP cladding layers are 1.2 micrometers in the first group of samples, and 0.6 micrometers in the second group of samples. Then, the present inventor has evaluated ten samples in each of the first and second groups by performing a reliability test. The samples have been APC driven at the temperature of 50° C. and the optical output power of 5 mW in the reliability test, estimated lifetimes have been calculated based on data obtained by the reliability test, and the median values of the estimated lifetimes have been compared. The estimated lifetimes are times at which the driving current values of the samples are estimated to reach 1.2 times their initial values, respectively. The median value of the estimated lifetimes of the samples in the first group (in which the thicknesses of the p-type and n-type cladding layers are 1.2 micrometers) obtained as above is about 10,000 hours, and the median value of the estimated lifetimes of the samples in the second group (in which the thicknesses of the p-type and n-type cladding layers are 0.6 micrometers) obtained as above is about 13,000 hours. This result shows that it is possible to increase the lifetimes of semiconductor laser elements and improve the reliability of the semiconductor laser elements by reducing the thicknesses of the cladding layers.

Figure 3:
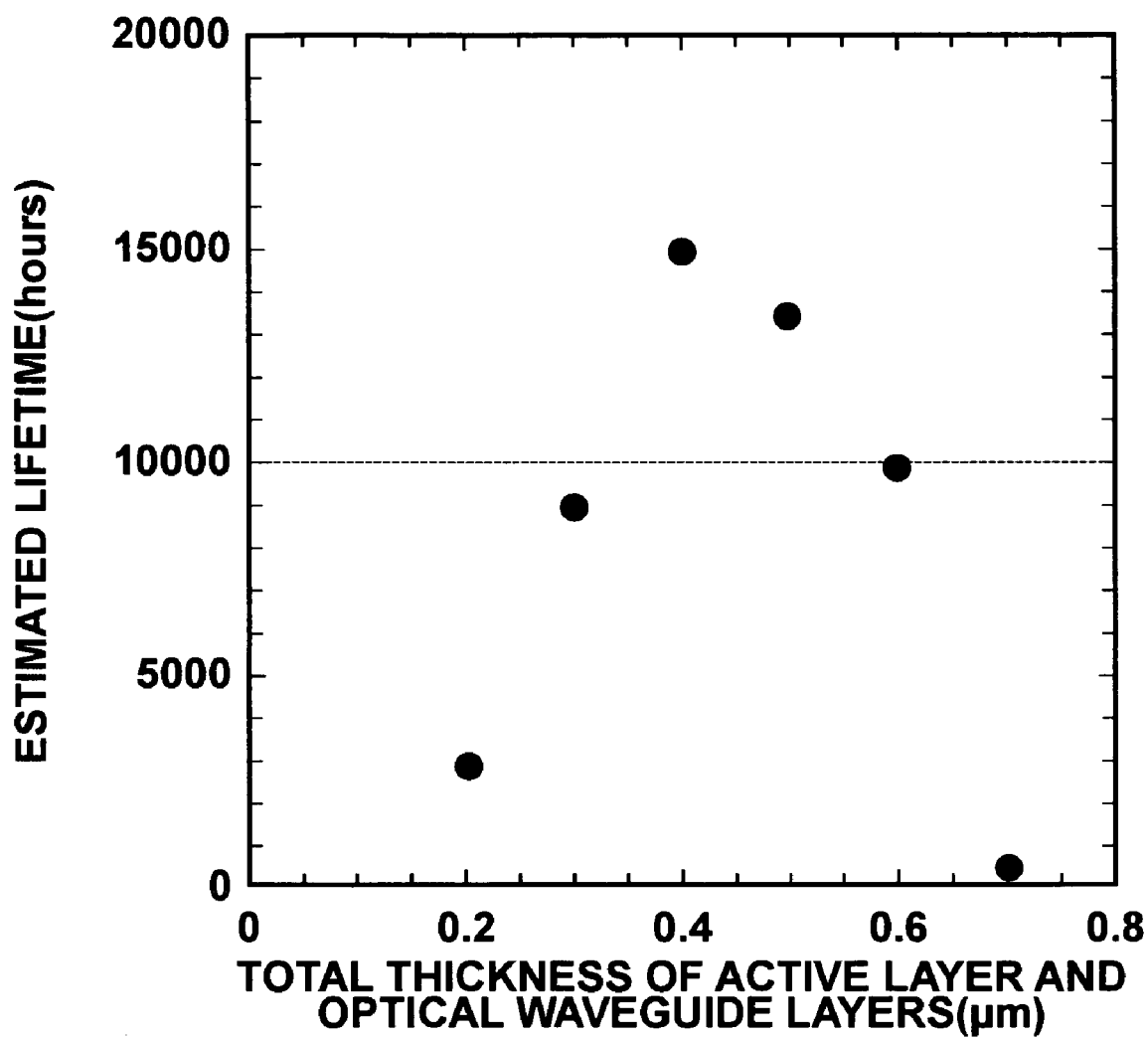
FIG. 3 is a graph indicating a relationship between the estimated lifetime and the total thickness of an active layer and optical waveguide layers.

In addition, in order to investigate the influence of the total thickness of the active layer and the optical waveguide layers in the red semiconductor laser elements, the present inventor has also produced a plurality of samples in each of which the total thickness of the active layer and the optical waveguide layers is different (i.e., the optical waveguide layers have different thicknesses), and observed variations in the lifetime characteristics with the total thickness. In the above samples, the active layer is constituted by three quantum-well layers each having a thickness of about 6 nm and barrier layers each having a thickness similar to the barrier layers, and the total thickness of the active layer is about 30 nm. The above samples have similar structures except for the thicknesses of the optical waveguide layers. The thicknesses of the p-type and n-type cladding layers are 1.2 micrometers, and the entire cladding layers are doped. FIG. 3 shows a relationship between the estimated lifetime and the total thickness of the active layer and the optical waveguide layers. In FIG. 3, the abscissa corresponds to the total thickness of the active layer and the optical waveguide layers, and the ordinate corresponds to the median value of the estimated lifetimes. The result of FIG. 3 shows that the preferable total thickness of the active layer and the optical waveguide layers is 0.3 to 0.65 micrometers. If the total thickness of the active layer and the optical waveguide layers is smaller than 0.30 micrometers, the lifetime characteristics deteriorate due to diffusion of Zn from the cladding layer. On the other hand, if the total thickness of the active layer and the optical waveguide layers is greater than 0.65 micrometers, the lifetime characteristics deteriorate due to weakening of the optical confinement. Further, as indicated in FIG. 3, it is more preferable that the total thickness of the active layer and the optical waveguide layers is 0.35 to 0.6 micrometers.

In addition, all of the contents of the Japanese patent application No. 2004-063880 are incorporated into this specification by reference.

What is claimed is:

1. A semiconductor laser element comprising:
a substrate made of GaAs;
a lower cladding layer formed above said substrate and made of $In_{0.49}(Al_{x1}Ga_{1-x1})_{0.51}P$ of a first conductive type which lattice-matches with GaAs, where x2<x1<1;
a lower optical waveguide layer formed above said lower cladding layer and made of $In_{0.49}(Al_{x2}Ga_{1-x2})_{0.51}P$ which lattice-matches with GaAs, where 0<x2<x1;
a strained active layer formed above said lower optical waveguide layer;
an upper optical waveguide layer formed above said active layer and made of $In_{0.49}(Al_{x2}Ga_{1-x2})_{0.51}P$ which lattice-matches with GaAs, where 0<x2<x1; and
an upper cladding layer formed above said upper optical waveguide layer and made of $In_{0.49}(Al_{x1}Ga_{1-x1})_{0.51}P$ of a second conductive type which lattice-matches with GaAs, where x2<x1<1;
wherein a total thickness of said lower optical waveguide layer, said active layer, and said upper optical waveguide layer is 0.30 micrometers or greater; and
wherein at least one of said lower cladding layer and said upper cladding layer has a thickness of 0.6 micrometers or smaller.

2. A semiconductor laser element according to claim 1, wherein said total thickness is 0.35 to 0.6 micrometers.

3. A semiconductor laser element according to claim 1, wherein at least one of said lower cladding layer and said upper cladding layer has a thickness of 0.8 micrometers or smaller.

4. A semiconductor laser element according to claim 2, wherein at least one of said lower cladding layer and said upper cladding layer has a thickness of 0.8 micrometers or smaller.

5. A semiconductor laser element according to claim 2, wherein at least one of said lower cladding layer and said upper cladding layer has a thickness of 0.6 micrometers or smaller.

6. A semiconductor laser element according to claim 1, wherein said active layer is made of $In_{0.49}(Al_{x3}Ga_{1-x3})_{0.51}P$, $0 \leq x3 < x2$, and said semiconductor laser element has an oscillation wavelength of 620 to 680 nm.

7. A semiconductor laser element according to claim 2, wherein said active layer is made of $In_{0.49}(Al_{x3}Ga_{1-x3})_{0.51}P$ $0 \leq x3 \leq x2$, and said semiconductor laser element has an oscillation wavelength of 620 to 680 nm.

8. A semiconductor laser element according to claim 3, wherein said active layer is made of $In_{0.49}(Al_{x3}Ga_{1-x3})_{0.51}P$, $0 \leq x3 < x2$, and said semiconductor laser element has an oscillation wavelength of 620 to 680 nm.

9. A semiconductor laser element according to claim 4, wherein said active layer is made of $In_{0.49}(Al_{x3}Ga_{1-x3})_{0.51}P$, $0 \leq x3 < x2$, and said semiconductor laser element has an oscillation wavelength of 620 to 680 nm.

10. A semiconductor laser element according to claim 1, wherein said active layer is made of $In_{0.49}(Al_{x3}Ga_{1-x3})_{0.51}P$, $0 \leq x3 < x2$, and said semiconductor laser element has an oscillation wavelength of 620 to 680 nm.

11. A semiconductor laser element according to claim 5, wherein said active layer is made of $In_{0.49}(Al_{x3}Ga_{1-x3})_{0.51}P$, $0 \leq x3 < x2$, and said semiconductor laser element has an oscillation wavelength of 620 to 680 nm.

* * * * *